(12) United States Patent
Kim

(10) Patent No.: US 8,106,429 B2
(45) Date of Patent: Jan. 31, 2012

(54) IMAGE SENSOR AND MANUFACTURING METHOD THEREOF

(75) Inventor: Tae Gyu Kim, Masan-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 378 days.

(21) Appl. No.: 12/199,762

(22) Filed: Aug. 27, 2008

(65) Prior Publication Data

US 2009/0057725 A1 Mar. 5, 2009

(30) Foreign Application Priority Data

Aug. 31, 2007 (KR) .................. 10-2007-0088257

(51) Int. Cl.
*H01L 29/66* (2006.01)

(52) U.S. Cl. ........ 257/257; 257/252; 257/253; 257/254; 257/258; 257/E21.135; 257/E21.136; 257/E21.137; 257/E21.138; 438/22; 438/24; 438/28; 438/48

(58) Field of Classification Search .................. 257/257, 257/252–254, 258, E21.135–E21.14; 438/48, 438/22, 24

See application file for complete search history.

(56) References Cited

U.S. PATENT DOCUMENTS

| | | | | |
|---|---|---|---|---|
| 6,316,286 B1* | 11/2001 | Trezza | ........................ | 438/107 |
| 6,423,560 B1* | 7/2002 | Trezza et al. | .................. | 438/25 |
| 6,485,993 B2* | 11/2002 | Trezza et al. | .................. | 438/22 |
| 6,759,262 B2* | 7/2004 | Theil et al. | ..................... | 438/48 |
| 6,765,276 B2* | 7/2004 | Fasen et al. | .................. | 257/437 |
| 6,809,358 B2* | 10/2004 | Hsieh et al. | .................... | 257/291 |
| 6,967,073 B2* | 11/2005 | Fasen et al. | .................... | 430/321 |
| 7,049,673 B2* | 5/2006 | Moussy et al. | ................ | 257/458 |
| 7,196,391 B2* | 3/2007 | Hsieh | ............................ | 257/444 |
| 7,288,429 B2* | 10/2007 | Yaung et al. | .................... | 438/74 |
| 2003/0038293 A1* | 2/2003 | Fasen et al. | .................... | 257/88 |
| 2003/0038326 A1* | 2/2003 | Fasen et al. | .................. | 257/414 |
| 2003/0127647 A1* | 7/2003 | Street et al. | ..................... | 257/59 |
| 2004/0002178 A1* | 1/2004 | Fasen et al. | .................... | 438/57 |
| 2005/0012840 A1* | 1/2005 | Hsieh et al. | .................. | 348/308 |
| 2005/0167709 A1* | 8/2005 | Augusto | ....................... | 257/292 |
| 2006/0164533 A1* | 7/2006 | Hsieh et al. | .................. | 348/317 |
| 2006/0249765 A1* | 11/2006 | Hsieh | ............................ | 257/292 |
| 2007/0105265 A1* | 5/2007 | Lai et al. | .......................... | 438/64 |
| 2008/0179716 A1* | 7/2008 | Liu | ............................... | 257/659 |

* cited by examiner

*Primary Examiner* — Thao Le
*Assistant Examiner* — Eric Jones
(74) *Attorney, Agent, or Firm* — The Law Offices of Andrew D. Fortney; Andrew D. Fortney; Theresa J. Mahan

(57) ABSTRACT

Disclosed is an image sensor. The image sensor includes a semiconductor substrate including a lower interconnection, a plurality of upper interconnection sections protruding upward from the semiconductor substrate, a first trench disposed between the upper interconnection sections such that the upper interconnection sections are spaced apart from each other, a bottom electrode disposed on an outer peripheral surfaces of the upper interconnection sections, a first conductive layer disposed on an outer peripheral surface of the bottom electrode, an intrinsic layer disposed on the semiconductor substrate including the first conductive layer and the first trench, and having a second trench on the first trench, a second conductive layer disposed on the intrinsic layer and having a third trench on the second trench, a light blocking part disposed in the third trench, and a top electrode disposed on the light blocking part and the second conductive layer.

19 Claims, 5 Drawing Sheets

IMAGE SENSOR AND MANUFACTURING METHOD THEREOF

The present application claims priority under 35 U.S.C. 119 to Korean Patent Application No. 10-2007-0088257 (filed on Aug. 31, 2007), which is hereby incorporated by reference in its entirety.

BACKGROUND

The invention relates to an image sensor and a manufacturing method thereof.

The image sensor is a semiconductor device for converting an optical image to an electrical signal, and includes a CCD (charge coupled device) image sensor and a CMOS (complementary metal oxide silicon) image sensor.

The CMOS image sensor includes a photodiode and at least one MOS transistor in each unit pixel, and sequentially detects electrical signals of each unit pixel in a switching mode to realize images. The CMOS image sensor may have a structure in which the photodiode (which converts a received light signal to an electrical signal) and the transistor(s) (which process the electrical signal) are horizontally disposed on a semiconductor substrate. According to the horizontal CMOS image sensor, the photodiode and the transistor are horizontally adjacent to each other on a substrate. Thus, an additional area for forming the photodiode is required.

SUMMARY

Embodiments of the invention provide an image sensor capable of vertically integrating a transistor circuit and a photodiode, and a manufacturing method thereof.

An image sensor according to one embodiment includes a semiconductor substrate including a lower interconnection, a plurality of upper interconnection sections on or above the semiconductor substrate, a first trench between adjacent upper interconnection sections such that the adjacent upper interconnection sections are spaced apart from each other, a bottom electrode on an outer peripheral surface of each upper interconnection section, a first conductive layer on an outer peripheral surface of each bottom electrode, an intrinsic layer on the semiconductor substrate and the first conductive layer and in the first trench, forming a second trench in the first trench, a second conductive layer on the intrinsic layer and forming a third trench in the second trench, a light blocking part in the third trench; and a top electrode on the light blocking part and the second conductive layer.

A method for manufacturing an image sensor according to another embodiment includes the steps of forming a lower interconnection on a semiconductor substrate, forming a plurality of upper interconnection sections on or above the semiconductor substrate, such that adjacent upper interconnection sections are spaced apart from each other, forming a bottom electrode on an outer peripheral surface of each upper interconnection section, forming a first conductive layer on an outer peripheral surface of each bottom electrode, forming an intrinsic layer on the semiconductor substrate and the first conductive layer and in the first trench, such that the intrinsic layer forms a second trench in the first trench, forming a second conductive layer in the second trench, the second conductive layer forming a third trench, forming a light blocking part in the third trench, and forming a top electrode on the light blocking part and the second conductive layer.

DETAILED DESCRIPTION OF THE EMBODIMENTS

Hereinafter, an image sensor and a manufacturing method thereof according to various embodiments will be described with reference to the accompanying drawings.

Figure 10:
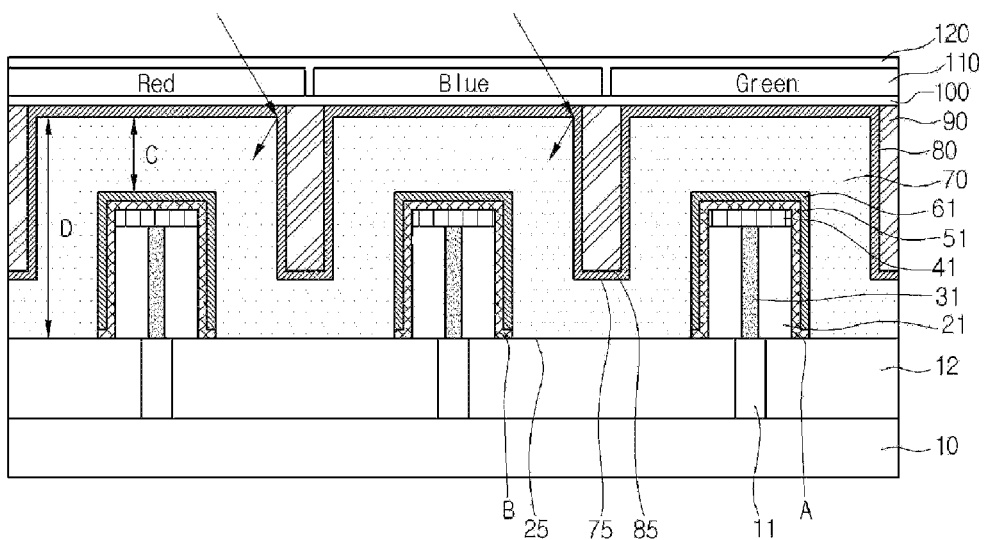

FIG. 10 is a sectional view illustrating an exemplary image sensor.

Referring to FIG. 10, an upper interconnection section A is disposed on a semiconductor substrate 10 including a lower interconnection 11. Although not shown in FIG. 10, a unit pixel may be formed in an active area of the semiconductor substrate 10. The circuit section of the unit pixel may include a transfer transistor, a reset transistor, a drive transistor, a select transistor, and a photodiode, which converts photocharges collected therein to electrical signals.

Further, an interlayer dielectric layer 12 and the lower interconnection 11 are disposed on the semiconductor substrate 10 such that the upper interconnection section A can be connected with the circuit section formed on substrate 10. A plurality of interlayer dielectric layers 12 and lower interconnections 11 can be formed on the semiconductor substrate 10, respectively.

The upper interconnection section A includes an upper interconnection 31 and a dielectric layer pattern 21 containing the upper interconnection 31. Each upper interconnection 31 is generally connected to one of the lower interconnections 11. The upper interconnection section A may be thicker than or have a greater height than the semiconductor substrate 10. The upper interconnection section A is spaced apart from an adjacent upper interconnection section B by a first trench 25, so that an upper interconnection section can be disposed in each unit pixel.

A metal pad 41 is disposed on the upper interconnection section A. A bottom electrode 51 is disposed on the outer peripheral surface of the upper interconnection section A and/or the metal pad 41. The bottom electrode 51 exposes the bottom surface of the first trench 25. The bottom electrode 51 may be formed (and/or conformally deposited) on the entire outer peripheral surface of the upper interconnection section (s), which may increase the area of the bottom electrode 51 and/or improve the capacity of the bottom electrode 51 for receiving electrons generated from the photodiode. Alternatively, the bottom electrode 51 may be on only an upper and/or horizontal surface of the metal pad 41.

Further, a first conductive layer pattern 61 of a photodiode is disposed (e.g., conformally deposited) on the outer peripheral surface of the upper interconnection section A and/or the bottom electrode 51. The first conductive layer pattern 61 may be an N-type conductive layer, and thus, may comprise n-doped silicon. The first conductive layer pattern 61 also exposes the bottom surface of the first trench 25 (e.g., the uppermost surface lower interconnection dielectric layer 12).

An intrinsic layer 70 of a photodiode is disposed on or over the semiconductor substrate 10, including the first conductive layer pattern 61, and in the first trench 25. The intrinsic layer 70 may include amorphous silicon. The intrinsic layer 70 is uniformly formed (and/or conformally deposited) on or over the semiconductor substrate 10. Thus, the intrinsic layer 70 formed on the first conductive layer 61 has a shallow area C, and the intrinsic layer 70 formed in the first trench 25 has a relatively deep area D. Further, a second trench 75 which may be proportional to the width of the first trench 25 is formed in the intrinsic layer 70 and/or in the first trench 25.

A second conductive layer 80 of a photodiode is disposed in the second trench 75 and on the intrinsic layer 70. The second conductive layer 80 may include a P-type conductive layer, and thus, may comprise p-doped silicon. The second conductive layer 80 is uniformly formed (and/or conformally deposited) on the semiconductor substrate 10. Thus, the second conductive layer 80, which is formed on the intrinsic layer 70, may have a relatively high height, but the second conductive layer 80 in the second trench 75 may have a relatively low thickness. Further, a third trench 85 which may be proportional to the width of the second trench 75 is formed in the second conductive layer 80 and/or in the second trench 75.

A light blocking part 90 is disposed in the third trench 85. For example, the light blocking part 90 may include a metal, such as tungsten, aluminum, titanium, tantalum, copper, or an alloy or conductive compound thereof. Further, the light blocking part 90 may have about the same height as that of the second conductive layer 80.

A top electrode 100 is disposed on the second conductive layer 80 and the light blocking part 90. For example, the top electrode 100 may include a transparent electrode such as ITO (indium tin oxide), CTO (cadmium tin oxide) or $ZnO_2$.

A color filter 110 and a planarized layer 120 are disposed on the top electrode 100. One color filter 10 is formed in each unit pixel to filter a color from incident light. Such a color filter layer 10 includes red, green and blue color filters (e.g., a transparent organic resist material and a red, green or blue dye).

According to the image sensor described above, the photodiode is disposed in each unit pixel to prevent crosstalk and noise. In detail, the first conductive layer of a photodiode is formed on the upper interconnection in each unit pixel to allow the photodiode to be disposed in each unit pixel, so that photocharges are shifted to a corresponding unit pixel, thereby preventing crosstalk and noise.

Further, the photodiode is disposed in each unit pixel by the light blocking layer to prevent light incident through the color filter from being incident into an adjacent photodiode, thereby improving the reliability of the image sensor.

Furthermore, since the photodiode simultaneously has the deep area D and shallow area C, a red signal, which causes photoelectric effect in the deep area, can be efficiently obtained.

Hereinafter, the method for manufacturing the image sensor according to the embodiment will be described with reference to FIGS. 1 to 10.

Figure 1:
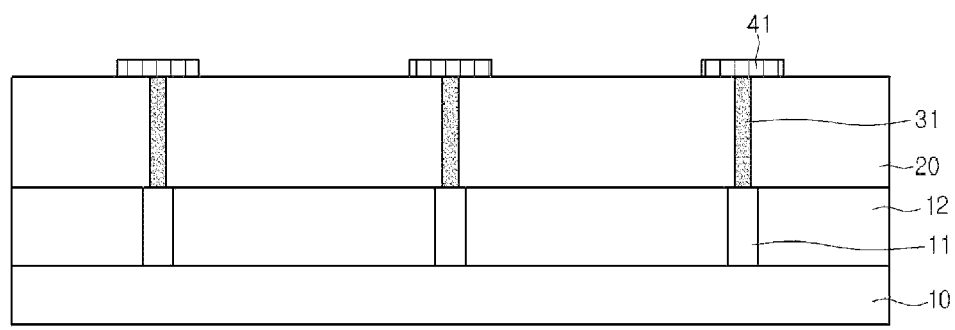
FIGS. 1 to 10 are sectional views illustrating an exemplary procedure for manufacturing an image sensor according to one or more embodiments of the invention.

Referring to FIG. 1, the upper interconnection 31 and a dielectric layer 20 are formed on the semiconductor substrate 10. The semiconductor substrate 10 includes the circuit section (not shown), on or in a single crystal silicon wafer, and the lower interconnection 11, which may comprise a conventional via material (e.g., tungsten, doped silicon, aluminum, copper, etc.).

Although not shown in FIG. 1, an isolation layer may be formed in the semiconductor substrate 10 to define the active area and a field area. Further, the circuit section may be connected to a photodiode, which will be described later, to convert collected photocharges into electrical signals, thereby forming each unit pixel, in which the circuit section may include a transfer transistor, a reset transistor, a drive transistor, a select transistor, and the like.

Further, the lower interconnection 11 and the interlayer dielectric layer 12 are formed on the semiconductor substrate 10 including the circuit section having the transistor structure as described above, thereby connecting a power line or a signal line with a circuit area.

The upper interconnection 31 formed on the semiconductor substrate 10 is formed in each unit pixel to connect a photodiode, which will be described later, with the lower interconnection 11, thereby transmitting photocharges to the circuit section.

The upper interconnection 31 may include various conductive materials such as metals, alloys and/or silicides. For example, the upper interconnection 31 may include aluminum, copper, cobalt, tungsten and the like.

Since the dielectric layer 20 formed on the semiconductor substrate 10 including the interlayer dielectric layer 12 has the same height as that of the upper interconnection 31, the dielectric layer 20 can expose the top surface of the upper interconnection 31. For example, the dielectric layer 20 may include an oxide layer and/or a nitride layer (e.g., as an underlying etch stop layer). The dielectric layer 20 is formed first by conventional chemical vapor deposition (CVD), and is generally planarized (e.g., by CMP) prior to patterning and etching to form vias or contact holes or trenches therein. The upper interconnections 31 are then formed in the vias or contact holes or trenches, generally by CVD and/or sputtering, followed by CMP to remove the upper interconnection material from outside the vias or contact holes or trenches.

The metal pad 41 is formed on the upper interconnection 31. The metal pad 41 may include various conductive materials such as metals, alloys and/or silicides, and has a width wider than that of the upper interconnection 31. For example, the metal pad 41 may include a metal such as Cr, Ti, TiW or Ta, which is first blanket-deposited onto the dielectric layer 20 and planarized/polished upper interconnections 31. The metal pad 41 may serve as a bottom electrode of a photodiode, which will be described later. The metal pad 41 is optional.

Figure 2:
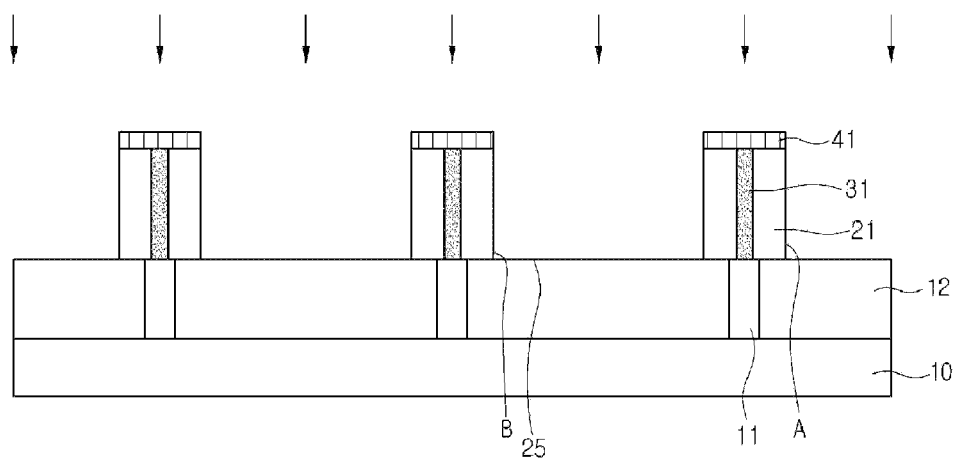

Then, referring to FIG. 2, the metal pads 41, dielectric layer pattern 21 and the first trench 25 are formed on the semiconductor substrate 10. The dielectric layer pattern 21 is formed by patterning and etching the metal layer for the metal pad to form metal pads 41, then etching the dielectric layer 20 using the metal pad 41 as an etch mask. Thus, the dielectric layer pattern 21 is formed at both sides of (e.g., surrounding or encompassing) the upper interconnection 31 to expose the surface of the interlayer dielectric layer 12, except for the upper interconnection 31. Hereinafter, the upper interconnection 31 and the dielectric layer pattern 21, which are connected with one unit pixel, will be referred to as the upper interconnection section A. Further, an exposure area between the upper interconnection section A and the upper interconnection section B adjacent to the upper interconnection section A will be referred to as the first trench 25.

The upper interconnection section A extends or protrudes upward from the semiconductor substrate 10 by the height of the upper interconnection 31 and/or the dielectric layer pattern 21. The upper interconnection section A is spaced apart from the upper interconnection section B by the first trench 25, so that the upper interconnection section A can be disposed in each unit pixel.

Figure 3:
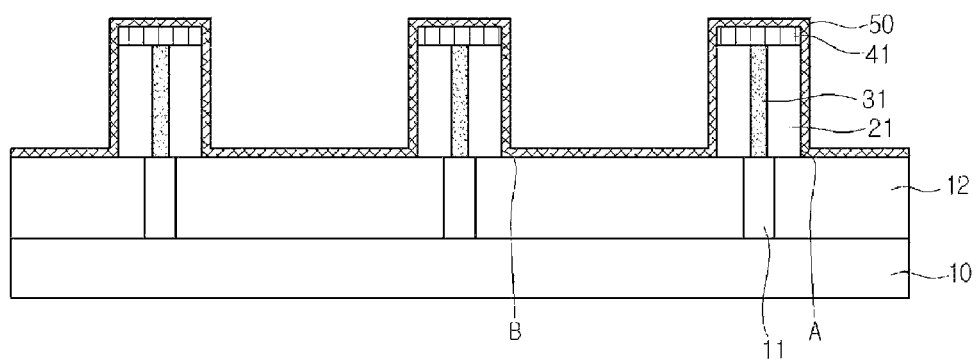

Then, referring to FIG. 3, a bottom electrode layer 50 is formed on or over the semiconductor substrate 10. The bottom electrode layer 50 is formed along the interlayer dielectric layer 12 and the upper interconnection section A, so that the bottom electrode layer 50 has step difference. For example, the bottom electrode layer 50 may include a metal such as Cr, Ti, TiW or Ta.

The photodiode is formed over the semiconductor substrate 10 and on the bottom electrode layer 50.

According to one embodiment, the photodiode uses an NIP diode. The NIP diode has a structure of an N-type amorphous silicon layer, an intrinsic amorphous silicon layer and a P-type amorphous silicon layer. Such a photodiode can have various structures, such as P-I-N, N-I-P, I-P and the like.

According to one embodiment, a photodiode having the N-I-P structure will be described. Hereinafter, the N-type amorphous silicon layer, the intrinsic amorphous silicon layer and the P-type amorphous silicon layer will be referred to as the first conductive layer 60, the intrinsic layer 70 and the second conductive layer 80, respectively.

Hereinafter, a method for forming the NIP photodiode will be described.

Figure 4:
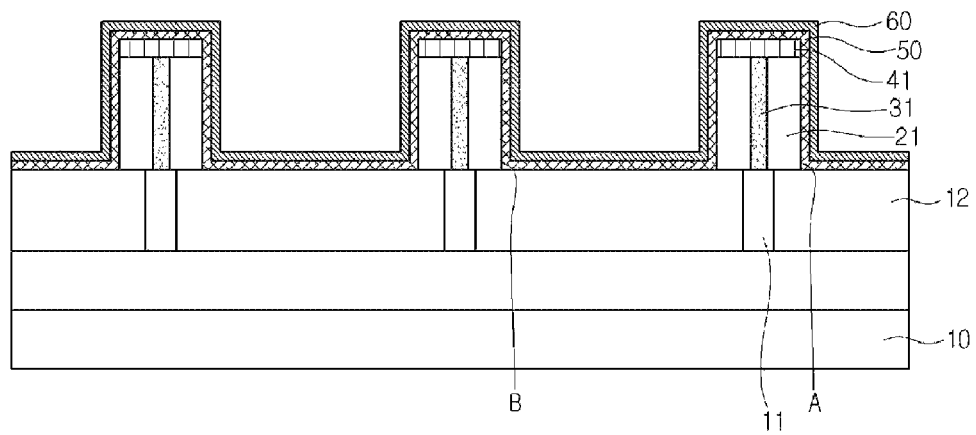

Referring to FIG. 4, the first conductive layer 60 is formed over the semiconductor substrate 10 and on the bottom electrode layer 50. The first conductive layer 60 can serve as an N layer or a P layer of the N-I-P diode employed in the embodiment. In detail, the first conductive layer 60 may include an N-type conductive layer. The scope of the present invention is not limited thereto. For example, the first conductive layer 60 can comprise N-doped amorphous silicon, and be formed using a PECVD process by supplying a gas mixture comprising a silicon source such as $SiH_4$ and/or $Si_2H_6$ and an N-dopant source such as $PH_3$ and/or $P_2H_6$ to form N-doped amorphous silicon. The first conductive layer 60 is formed along the bottom electrode layer 50 so that the first conductive layer 60 has step difference corresponding to the step difference between the upper interconnection section A and the interlayer dielectric layer 12 and/or the semiconductor substrate 10.

Figure 5:
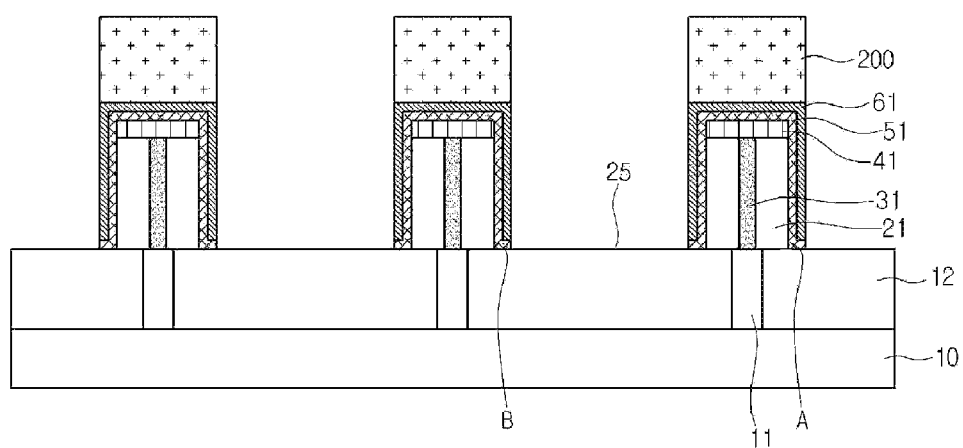

Then, referring to FIG. 5, the bottom electrode 51 and the first conductive layer pattern 61 are formed on the outer peripheral surface of the upper interconnection section A. The bottom electrode 51 can be formed simultaneously with the first conductive layer pattern 61. A photoresist pattern 200 may be formed on the material for the first conductive layer 60, which covers an area substantially corresponding to the upper interconnection section A, and exposing the remaining areas. Then, the bottom electrode layer 50 and the first conductive layer 60 are etched using the photoresist pattern 200 as an etch mask, thereby exposing the interlayer dielectric layer 12 at the bottom surface of the first trench 25, and forming the bottom electrode 51 and the first conductive layer pattern 61 that surround the outer peripheral surface of the upper interconnection section A.

The bottom electrode 51 and the first conductive layer pattern 61 formed on the upper interconnection section A are disposed in each unit pixel, so that crosstalk and noise can be prevented in the image sensor. Thereafter, the photoresist pattern 200 is removed.

Figure 6:
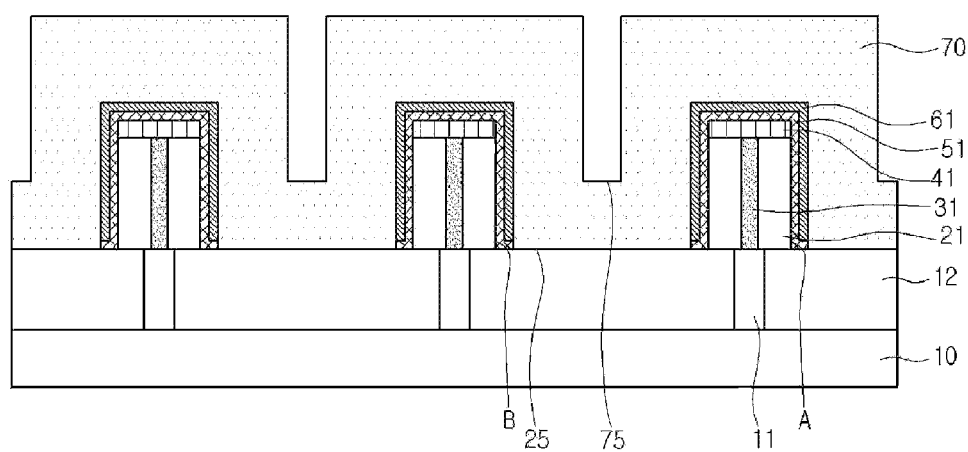

Then, referring to FIG. 6, the intrinsic layer 70 is formed on the semiconductor substrate 10 including the first conductive layer pattern 61. The intrinsic layer 70 can serve as the intrinsic layer of the N-I-P diode employed in the embodiment.

The intrinsic layer 70 can comprise amorphous silicon. For example, the intrinsic layer 70 can be formed by PECVD, supplying a silicon source such as $SiH_4$ to form amorphous silicon.

In detail, the intrinsic layer 70 can have a thickness greater than that of the second conductive layer 80 by about 10 to 1,000 times. As described above, as the intrinsic layer 70 becomes thicker, the depletion area of the PIN diode is increased, so that a great amount of photocharges can be easily stored and generated.

Since the intrinsic layer 70 is formed in the first trench 25 and on the first conductive layer 61, the intrinsic layer 70 can have a step difference corresponding to that of the upper interconnection section A. The intrinsic layer 70 can be uniformly or conformally deposited using the PECVD process. As shown in FIG. 10, the intrinsic layer 70 formed on the upper interconnection section A has a shallow area C, and the intrinsic layer 70 formed in the first trench 25 has a deep area D. In detail, the intrinsic layer 70 has different heights due to the difference between the upper interconnection section A and the first trench 25. In particular, since the intrinsic layer 70 deposited in the first trench 25 is deposited in proportion to the height and width of the first trench 25, a second trench 75 is formed in the intrinsic layer 70.

Thus, an additional process for etching the intrinsic layer 70 is not necessary (although a simple etchback can be performed, if desired), so that etching damage can be prevented and dark characteristics can be improved. Further, when forming the intrinsic layer 70 according to the structure of the upper interconnection section A and the first trench 25, the second trench 75 is formed, so that the intrinsic layer 70 can be disposed in each unit pixel.

Figure 7:
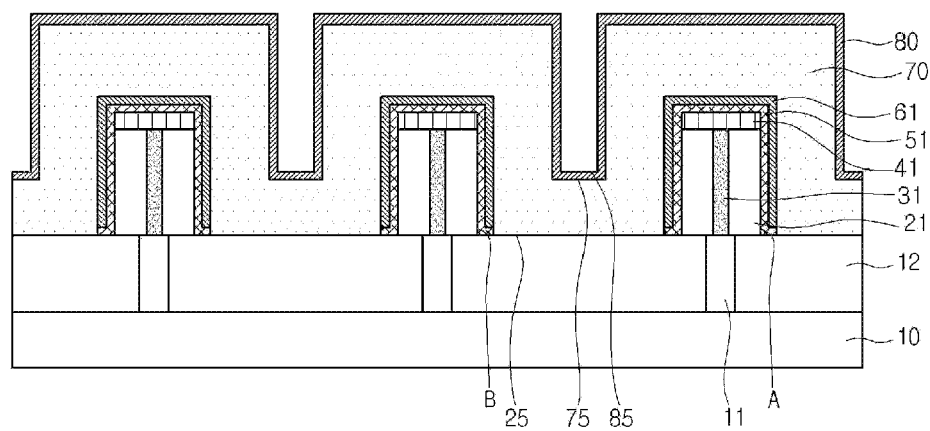

Then, referring to FIG. 7, the second conductive layer 80 is formed on the intrinsic layer 70. The second conductive layer 80 can be formed simultaneously with the intrinsic layer 70.

The second conductive layer 80 can serve as a P layer of the N-I-P diode employed in the embodiment. In detail, the second conductive layer 80 may include a P-type conductive layer. The scope of the present invention is not limited thereto. For example, the second conductive layer 80 can be formed by PECVD, supplying a gas mixture comprising a silicon source such as of $SiH_4$ and/or $Si_2H_6$ and a boron source such as $BH_3.OEt_2$ and/or $B_2H_6$ to form P-doped amorphous silicon.

The second conductive layer 80 is formed on the intrinsic layer 70 and in the second trench 75, so that the second conductive layer 80 can be formed along the intrinsic layer 70 having the step difference. Thus, the second conductive layer 80 has different heights corresponding to the height difference between the intrinsic layer 70 and the second trench 75. In particular, a third trench 85 is formed in the second conductive layer 80 in proportion to the height and width of the second trench 75.

The photodiode including the first conductive layer pattern 61, the intrinsic layer 70 and the second conductive layer 80 are formed on or over the semiconductor substrate 10 including the circuit section as described above, so that the area of the photodiode can be expanded, yet remain within the area of the circuit portion (not shown, but which may include a transfer transistor, an optional reset transistor, a drive transistor, and a select transistor). Thus, a fill factor can approach or approximate to 100%.

Further, the bottom electrode 51 and the first conductive layer pattern 61 of the photodiode are disposed in each unit pixel, so that crosstalk and noise can be prevented. Furthermore, the bottom electrode 51 of the photodiode surrounds the upper interconnection section A, so that they have a wide area. Thus, the capacity for receiving photocharges generated from the photodiode can be improved. In addition, the photodiode makes contact with the bottom electrode 51, thereby forming a Schottky diode. Thus, power consumption can be minimized and a high speed operation can be performed.

Figure 8:
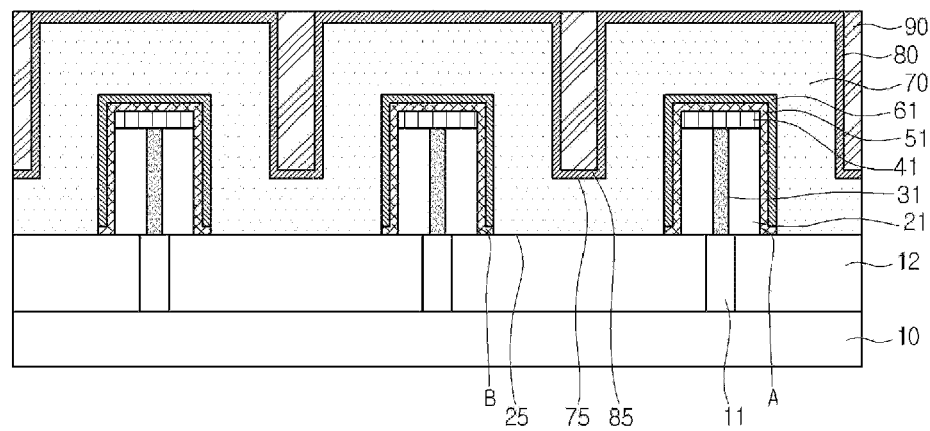

Then, referring to FIG. 8, the light blocking part 90 is formed in the third trench 85 of the second conductive layer 80. The light blocking part 90 can be formed by depositing a metal layer on the second conductive layer 80 and in the third trench 85, and then planarizing the metal layer. The metals and planarization method may be as described elsewhere herein. For example, the light blocking part 90 has about the same height as that of the second conductive layer 80 by performing a CMP process on the metal layer. Further, the light blocking part 90 may include various conductive materials such as metals, alloys or silicides. For example, the light blocking part 90 may include aluminum, tungsten, titanium and the like.

Furthermore, the light blocking part 90 is formed in the third trench 85 to allow the photodiode to be disposed in each unit pixel, thereby serving as an isolation layer. In detail, the light blocking part 90 can prevent light incident through the color filter from being incident into an adjacent photodiode.

Figure 9:
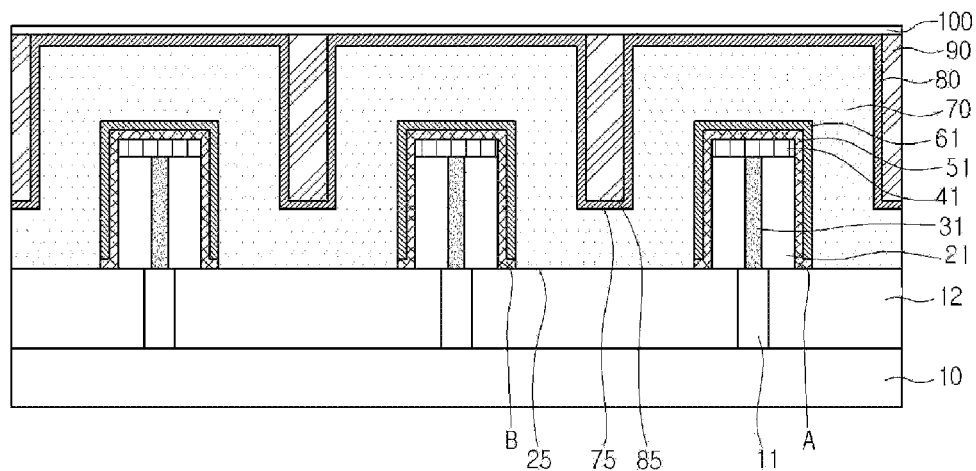

Then, referring to FIG. 9, a top electrode 100 is formed on the semiconductor substrate 10 including the photodiode and the light blocking part 90. The top electrode 100 can comprise a transparent electrode having good light transmission characteristics and high conductivity. For example, the top electrode 100 may include one or more of ITO, CTO and $ZnO_2$.

Then, referring to FIG. 10, the color filter layer 110 is formed on the top electrode 100. The color filters in layer 110 use dyed photoresist. Further, one color filter 110 is formed in each unit pixel to filter a color from incident light. Such color filters for layer 110 include red, green and blue color filters.

Further, in order to compensate for a step difference of the color filter 110, a planarized (or planarization) layer 120 can be formed on the color filter 110. Although not shown in FIG. 10, a micro lens can be additionally formed on the planarization layer 120, over an individual color filter in layer 110.

As described above, since the color filter layer 110 is formed on or over the photodiode and (at least partly over) the light blocking part 90, light passing through the color filter 110 can be incident into a corresponding photodiode to generate electrons. Then, the electrons can be collected by the bottom electrode 51 in each unit pixel, and transmitted to the lower interconnection 11 through the upper interconnection 31. For example, light vertically incident to the red color filter 110 is incident to a corresponding photodiode area below the red color filter 110, and then can be transmitted to the circuit section (not shown) through the corresponding upper interconnection 31. At this time, light incident to the red color filter 110 with a relatively high inclination angle may be incident to an adjacent photodiode area (e.g., a photodiode corresponding to the blue color filter 110), so that crosstalk may occur. In order to prevent crosstalk, the light blocking part 90 is formed between the photodiodes and/or unit pixel areas according to one embodiment. In detail, light incident to the red color filter 110 with an inclination angle can be prevented from being incident to a photodiode of an adjacent pixel by the light blocking part 90 disposed between the adjacent photodiodes.

Further, when light is incident to the photodiode by passing through the color filter 110, a red color may cause photoelectric effect in a relatively deep area, as compared with blue and green colors. In this regard, according to an embodiment, even if the intrinsic layer 70 of the photodiode has a relatively small thickness, the deep area D and the shallow area C are formed in the photodiode by the structure of the upper interconnection section A, so that signals having wavelength bands of red, blue and green colors can be efficiently obtained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is
1. An image sensor comprising:
a semiconductor substrate including a lower dielectric layer and a lower interconnection in the lower dielectric layer;
a plurality of upper interconnection sections on or above the semiconductor substrate, wherein each upper interconnection section comprises a dielectric pattern, an upper interconnection therein and a metal pad in direct contact with an uppermost surface of the upper interconnection and an uppermost surface of the dielectric pattern;
a first trench between adjacent upper interconnection sections;
a bottom electrode on an entire exposed outer peripheral surface of each upper interconnection section and in direct contact with the lower dielectric layer;
a first conductive layer on an uppermost surface and sidewalls of the bottom electrode;
an intrinsic layer over an entire surface of the semiconductor substrate and the first conductive layer, and in the first trench, forming a second trench in the first trench;
a second conductive layer on the intrinsic layer and forming a third trench in the second trench;
a light blocking part in the third trench; and
a top electrode on the light blocking part and the second conductive layer.

2. The image sensor as claimed in claim 1, further comprising a metal pad on an uppermost surface of each upper interconnection section, wherein the bottom electrode is also on the metal pad.

3. The image sensor as claimed in claim 2, wherein the upper interconnection sections each include an upper interconnection and a dielectric pattern containing the upper interconnection, and the bottom electrode is on the uppermost surface and sidewalls of the metal pad and sidewalls of the dielectric pattern.

4. The image sensor as claimed in claim 1, wherein the light blocking part includes metal.

5. The image sensor as claimed in claim 1, wherein the second conductive layer has a height substantially equal to a height of the light blocking part.

6. The image sensor as claimed in claim 1, further comprising a color filter on or over the top electrode.

7. The image sensor as claimed in claim 1, wherein the intrinsic layer has a first depth on the uppermost surface of the first conductive layer and a second depth on the semiconductor substrate including the lower interconnection, wherein the second depth is greater than the first depth.

8. A method for manufacturing an image sensor, the method comprising:

forming a lower interconnection in a lower dielectric layer and on a semiconductor substrate;

forming a plurality of upper interconnection sections on or above the semiconductor substrate, such that a first trench exists between adjacent upper interconnection sections, wherein each upper interconnection section comprises a dielectric pattern, an upper interconnection therein and a metal pad in direct contact with an uppermost surface of the upper interconnection and an uppermost surface of the dielectric pattern;

forming a bottom electrode on an entire exposed outer peripheral surface of each of the upper interconnection sections and in direct contact with the lower dielectric layer;

forming a first conductive layer on an uppermost surface and sidewalls of the bottom electrode;

forming an intrinsic layer over an entire surface of the semiconductor substrate and the first conductive layer and in the first trench, in which the intrinsic layer forms a second trench in the first trench;

forming a second conductive layer having a third trench in the second trench;

forming a light blocking part in the third trench; and forming a top electrode on the light blocking part and the second conductive layer.

9. The method as claimed in claim 8, wherein forming the upper interconnection sections comprises:

forming a dielectric layer on the semiconductor substrate;

forming an upper interconnection in the dielectric layer, the upper interconnection connected to the lower interconnection;

forming a metal pad on the dielectric layer; and etching the dielectric layer using the metal pad as a mask to form the dielectric pattern.

10. The method as claimed in claim 9, wherein etching the dielectric layer comprises forming a first trench between the adjacent upper interconnections by etching the dielectric layer.

11. The method as claimed in claim 10, wherein each of the upper interconnection sections comprises a dielectric pattern and an upper interconnection in the dielectric pattern, and the bottom electrode is formed on an uppermost surface and sidewalls of the metal pad and on sidewalls of the dielectric pattern.

12. The method as claimed in claim 8, wherein forming the intrinsic layer comprises depositing the intrinsic layer on the semiconductor substrate, the first conductive layer and in the first trench by a PECVD process, so that the second trench is formed above the first trench.

13. The method as claimed in claim 8, wherein forming the second conductive layer comprises depositing the second conductive layer on the intrinsic layer and in the second trench by a PECVD process, so that the third trench is formed in or above the second trench.

14. The method as claimed in claim 8, wherein forming the light blocking part comprises:

forming a metal layer on the second conductive layer and in the third trench; and forming the light blocking part in the third trench by etching the metal layer.

15. The method as claimed in claim 14, wherein etching the metal layer comprises chemical mechanical polishing the metal layer.

16. The method as claimed in claim 8, further comprising forming a color filter on or above the top electrode.

17. The method as claimed in claim 16, comprising forming a plurality of color filters on or above the top electrode.

18. The method as claimed in claim 17, wherein a first color filter completely overlaps a first one of the upper interconnection sections, a second color filter completely overlaps a second one of the upper interconnection sections, and a third color filter completely overlaps a third one of the upper interconnection sections.

19. The method as claimed in claim 8, wherein the adjacent upper interconnection sections are spaced apart from each other by a first predetermined distance.

* * * * *